(12) United States Patent
Kim

(10) Patent No.: US 8,126,411 B2
(45) Date of Patent: Feb. 28, 2012

(54) APPARATUS AND METHOD FOR POWER AMPLIFICATION WITH DELAY CONTROL IN WIRELESS COMMUNICATION SYSTEM

(75) Inventor: Byung-Wook Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 661 days.

(21) Appl. No.: 12/287,473

(22) Filed: Oct. 9, 2008

(65) Prior Publication Data
US 2009/0096499 A1    Apr. 16, 2009

(30) Foreign Application Priority Data
Oct. 10, 2007    (KR) .................. 10-2007-0101827

(51) Int. Cl.
*H04B 1/04* (2006.01)
(52) U.S. Cl. ...................... 455/126; 455/108
(58) Field of Classification Search .................. 455/126
See application file for complete search history.

(56) References Cited

U.S. PATENT DOCUMENTS

| | | | |
|---|---|---|---|
| 6,646,501 B1 * | 11/2003 | Wessel | 330/10 |
| 7,010,280 B1 * | 3/2006 | Wilson | 455/126 |
| 7,212,791 B2 * | 5/2007 | Arayashiki | 455/91 |
| 7,372,917 B2 * | 5/2008 | Jensen | 375/296 |
| 7,573,949 B2 * | 8/2009 | Matsuura et al. | 375/295 |
| 7,715,808 B2 * | 5/2010 | Shimizu et al. | 455/108 |
| 7,778,352 B2 * | 8/2010 | Jensen et al. | 375/297 |
| 2005/0079835 A1 * | 4/2005 | Takabayashi et al. | 455/127.1 |
| 2005/0153669 A1 * | 7/2005 | Suzuki et al. | 455/103 |
| 2007/0189431 A1 * | 8/2007 | Waheed et al. | 375/376 |
| 2008/0242246 A1 * | 10/2008 | Minnis et al. | 455/127.1 |
| 2009/0097591 A1 * | 4/2009 | Kim | 375/297 |
| 2011/0068867 A1 * | 3/2011 | Moses et al. | 330/131 |

\* cited by examiner

*Primary Examiner* — Thomas J Hiltunen

(57) ABSTRACT

A transmitting apparatus and method for power amplification with delay control in a wireless communication system are provided. The apparatus includes signal converters, a delay difference measurer, and a delay controller. The signal converters separate a baseband signal into an envelope signal and a phase modulated signal. The delay difference measurer measures a delay difference between an envelope signal path and a phase modulated signal path using a correlation coefficient extraction and interpolation technique. The delay controller sets a delay in a clock period unit to a signal path having a small delay and sets a delay by a remainder delay difference to a signal path having a large delay, depending on the measured delay difference.

23 Claims, 12 Drawing Sheets

APPARATUS AND METHOD FOR POWER AMPLIFICATION WITH DELAY CONTROL IN WIRELESS COMMUNICATION SYSTEM

CROSS-REFERENCE TO RELATED APPLICATION(S) AND CLAIM OF PRIORITY

The present application claims priority under 35 U.S.C. §119(a) to a Korean Patent Application filed in the Korean Intellectual Property Office on Oct. 10, 2007 and assigned Serial No. 2007-101827, the contents of which are herein incorporated by reference.

TECHNICAL FIELD OF THE INVENTION

The present invention relates generally to an apparatus and method for amplifying power with a time delay control in a wireless communication system.

BACKGROUND OF THE INVENTION

With the generalization of mobile communication, digital signals modulated in a mobile terminal and a base station have to be amplified up to desired transmission outputs using a radio frequency (RF) power amplifier. In order to transmit a signal with no distortion, the RF power amplifier requires high linearity and high efficiency.

With the high efficiency of the power amplifier, research for an Envelope Elimination and Restoration (EER) based transmitter has been actively conducted. The EER based transmitter is a system for controlling the power supply of a power amplifier to follow an envelope of a transmitted signal. The EER based transmitter increases the amplitude of the power source of a power amplifier when the amplitude of a transmitted signal increases, and decreases the amplitude of the power source when the amplitude of the transmitted signal decreases. This method can enhance power efficiency compared to a method using a fixed power source that is designed considering the maximum amplitude of a transmitted signal. However, in order to prevent a distortion of an output signal of the power amplifier, an output signal of an envelope signal amplifier for controlling the amplitude of a power source of the power amplifier that should synchronize with a phase modulated signal is inputted to the power amplifier in the EER based transmitter. That is, the EER based transmitter needs timing adjustment between the output signal of the envelope signal amplifier and the phase modulated signal input to the power amplifier. A failure in accurate time alignment leads to a distortion of a spectrum characteristic of the output signal of the power amplifier.

A function of accurate time alignment between respective signals has to be realized to prevent the distortion of the spectrum characteristic of the output signal of the power amplifier. To realize the time alignment function, it requires to accurately measure a time taken to supply a baseband signal to a power amplifier via an envelope signal path and a time taken for a phase modulated signal to be up modulated and pass a power amplifier path, and requires to calculate a difference of time taken for transmission by path and adjust a delay by path.

For accurate time alignment, the conventional art has proposed several technologies for measuring a delay difference between an envelope signal path and a phase signal path and realizing time alignment on the basis of it. As for conventional technologies, there are a method for measuring a distorted signal generated due to a delay difference to measure the delay difference (US Patent Application Publication No. 2006/0246856 A1 entitled "TRANSMITTER APPARATUS"), a method for measuring a phase difference of a test signal (Korean Patent Application No. 10-2005-0003164 entitled "METHOD FOR TIMING ADJUSTMENT IN WIRELESS COMMUNICATION APPARATUS"), a method for delay measurement through correlation coefficient measurement (US Patent Application Publication No. 2006/0234652 A1 entitled "TRANSMISSION APPARATUS, COMMUNICATION APPARATUS AND MOBILE RADIO APPARATUS") and the like. As for methods for correcting the thus measured delay, there are a method for performing time alignment by adjusting a phase of a digital clock (Korean Patent Application No. 10-2005-0003164 entitled "METHOD FOR TIMING ADJUSTMENT IN WIRELESS COMMUNICATION APPARATUS"), a method for controlling a delay using only a delay buffer for a digital signal path (US Patent Application Publication No. 2006/0234652 A1 entitled "TRANSMISSION APPARATUS, COMMUNICATION APPARATUS AND MOBILE RADIO APPARATUS"), a method for adjusting number of serial connection of power amplifiers for amplifying phase modulated signals (US Patent Application Publication No. 2006/0264186 A1 entitled "TRANSMITTER") and the like.

However, it is difficult to derive a quantitative delay difference using the method for measuring a distorted signal generated due to a delay difference and performing time alignment and the method for measuring a phase difference of a test signal. The method for delay measurement through correlation coefficient measurement cannot set a delay of less than a clock period because a delay is set in a clock period unit.

Among the methods for correcting a delay, the method for adjusting a phase of a digital clock to perform time alignment on the basis of an estimated delay difference has a disadvantage of making it difficult to guarantee accurate operation performance depending on an operation characteristic of a data converter. The method for time alignment using a buffer cannot realize time alignment of less than a clock unit. The method for adjusting the number of serial connection of a power amplifier has a disadvantage of system size and cost increase, limited accuracy and the like.

SUMMARY OF THE INVENTION

To address the above-discussed deficiencies of the prior art, it is a primary aspect of the present invention to substantially solve at least the above problems and/or disadvantages and to provide at least the advantages below. Accordingly, one aspect of the present invention is to provide an apparatus and method for power amplification, for measuring a delay difference between different path signals, thus enhancing the accuracy of delay correction on an Envelope Elimination and Restoration (EER) basis in a wireless communication system.

The above aspects are achieved by providing an apparatus and method for power amplification with delay control in a wireless communication system.

According to one aspect of the present invention, a transmitting apparatus for power amplification with delay control in a wireless communication system is provided. The apparatus includes signal converters, a delay difference measurer, and a delay controller. The signal converters separate a baseband signal into an envelope signal and a phase modulated signal. The delay difference measurer measures a delay difference between an envelope signal path and a phase modulated signal path using a correlation coefficient extraction and interpolation technique. The delay controller sets a delay in a clock period unit to a signal path having a small delay and sets a delay by a remainder delay difference to a signal path having a large delay, depending on the measured delay difference.

According to another aspect of the present invention, a method for power amplification with delay control in a wireless communication system. The method includes separating a baseband signal as an envelope signal and a phase modulated signal, measuring a delay difference between an envelope signal path and a phase modulated signal path using a correlation coefficient extraction and interpolation technique, and setting a delay in a clock period unit to a signal path having a small delay and setting a delay by a remainder delay difference to a signal path having a large delay, depending on the measured delay difference.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged.

An apparatus and method for compensating for a delay through correlation coefficients of an envelope signal, a phase signal, and a baseband signal and interpolation and performing power amplification on an Envelope Elimination and Restoration (EER) basis in a wireless communication system according to an exemplary embodiment of the present invention are described below.

Figure 1:
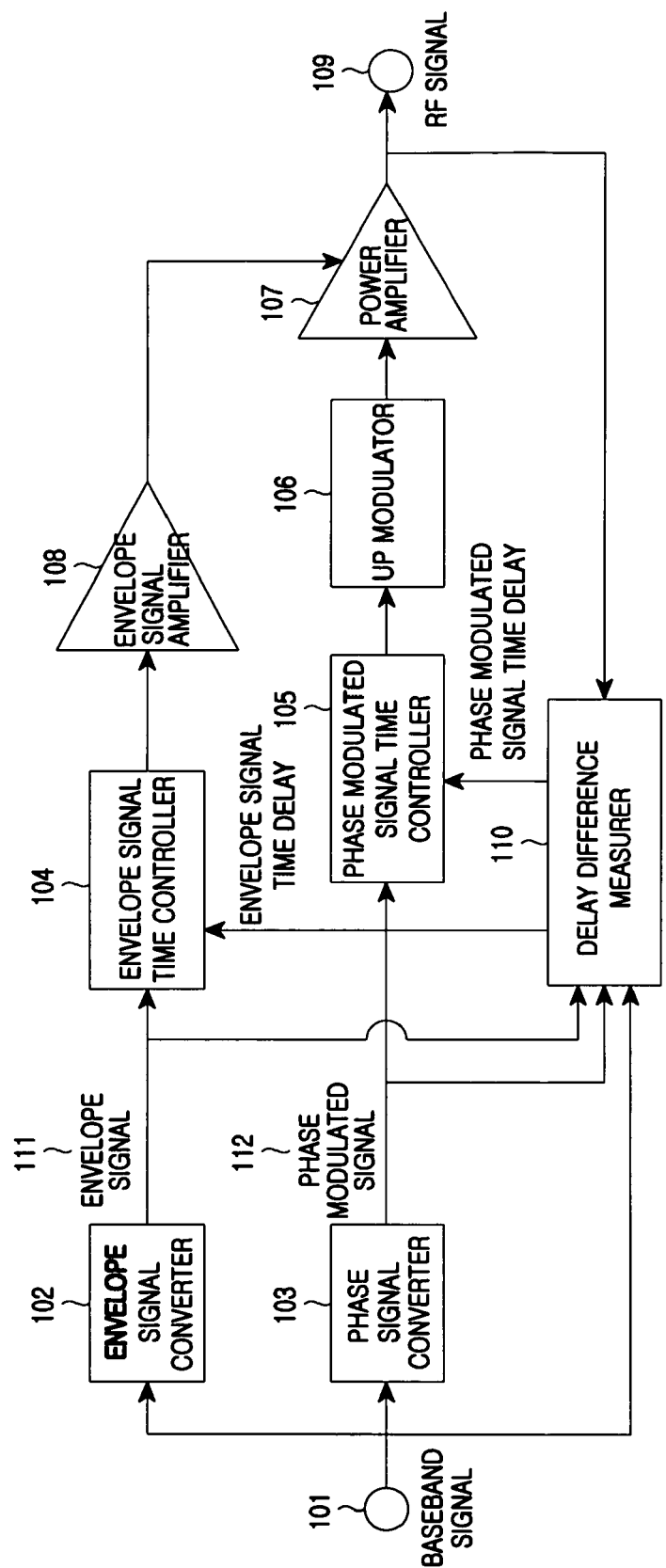
FIG. 1 is a block diagram illustrating a transmitting apparatus for power amplification based on Envelope Elimination and Restoration (EER) according to an exemplary embodiment of the present invention.

FIG. 1 is a block diagram illustrating a transmitting apparatus for power amplification based on EER according to an exemplary embodiment of the present invention.

Referring to FIG. 1, the transmitting apparatus for power amplification includes an envelope signal converter 102 for outputting an amplitude signal of a baseband signal 101, a phase signal converter 103 for generating a phase modulated signal using phase information on the baseband signal 101, an envelope signal time controller 104 for receiving a delay difference from a delay difference measurer 110 and controlling a delay of an envelope signal 111, a phase modulated signal time controller 105 for receiving a delay difference from the delay difference measurer 110 and controlling a delay of a phase modulated signal 112, an up modulator 106 for up modulating the phase modulated signal 112 into a radio frequency (RF) band signal, a power amplifier 107 for amplifying the up-modulated phase modulated signal, an envelope signal amplifier 108 for supplying a power source of the power amplifier 107 depending on the amplitude of the envelope signal 111, the delay difference measurer 110 for measuring a delay difference of a signal by path using an RF signal 109 output through the power amplifier 107, and the like.

The baseband signal 101, a complex signal, is expressed using an envelope representing amplitude and a phase value determined by an amplitude ratio of the real part of the complex signal to the imaginary part. The RF signal 109 outputted through the power amplifier 107 follows the amplitude of the envelope signal 111.

Figure 2:
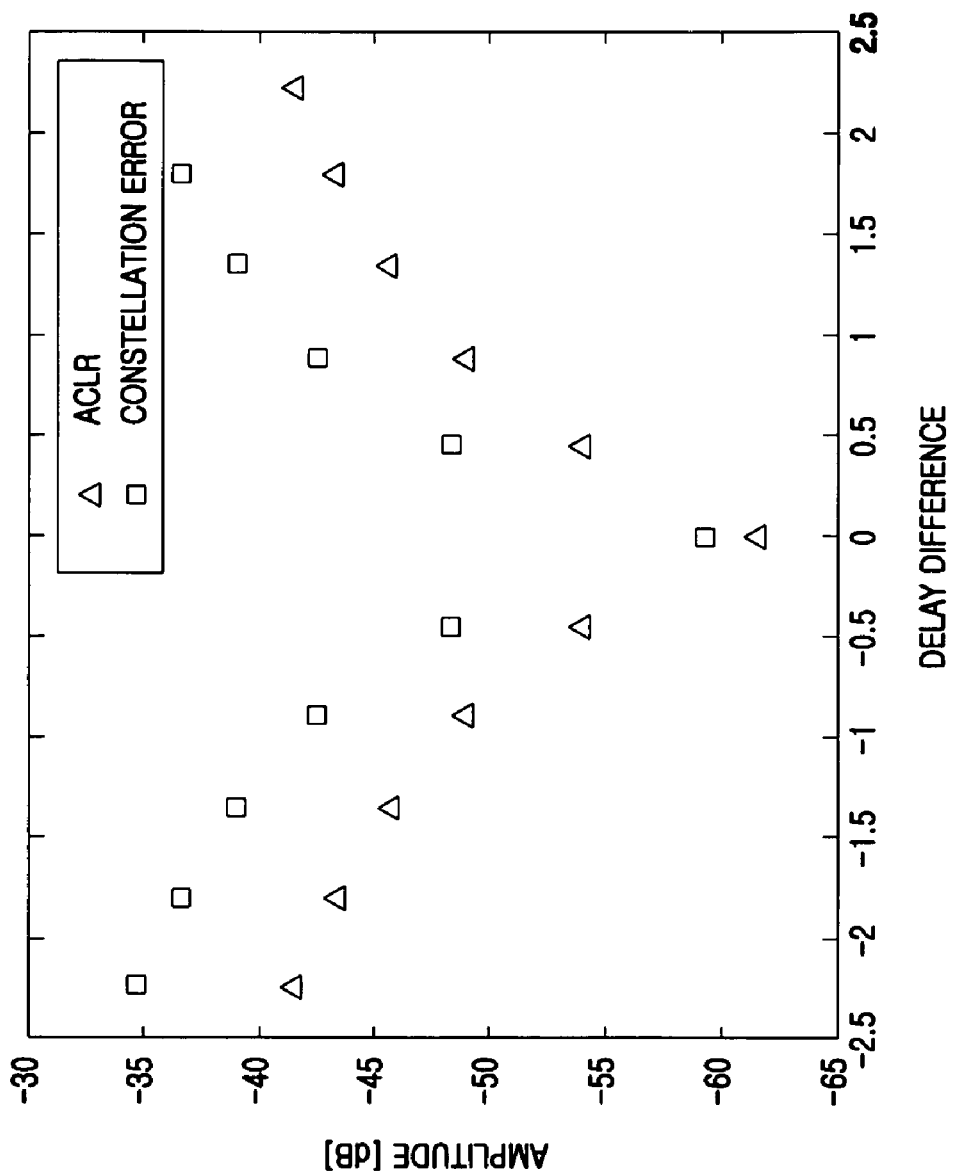
FIG. 2 is a graph illustrating signal performance degraded due to a delay time difference between an envelope signal and a phase modulated signal.

A general transmitter supplies a power source to the power amplifier 107 at a constant voltage. The general transmitter determines and supplies the amplitude of a source voltage considering the largest envelope such that the power amplifier 107 does not operate in saturation. However, this causes a decrease in power efficiency when an envelope is smaller than the maximum value. Thus, when a signal has a small envelope, the general transmitter supplies a source voltage having small amplitude to the power amplifier 107, thus being able to increase power efficiency. In this way, an EER based transmitter supplies a source voltage to the power amplifier 107. The EER based transmitter structure can advantageously enhance power efficiency, but requires synchronization between a time at which the envelope signal 111 is supplied to the power amplifier 107 and a time at which the phase modulated signal 112 is supplied to the power amplifier 107. A lack of synchronization degrades performance of the RF signal 109 output from the power amplifier 107. FIG. 2 is a graph illustrating signal performance degraded due to a delay time difference between an envelope signal and a phase modulated signal. The performance of the RF signal 109 can be expressed by an Adjacent Channel Leakage Ratio (ACLR) of a transmitted signal or a constellation error. In FIG. 2, the horizontal axis denotes the delay difference, and the vertical axis denotes amplitudes of an ACLR and constellation error. Here, the ACLR is yardstick representing the linearity of a power amplifier in a wireless communication system. FIG. 2 shows that the amplitudes of the ACLR and constellation error increase as the delay difference increases.

A description of the envelope signal time controller 104, the phase modulated signal time controller 105, and the delay difference measurer 110 for establishing an agreement between the time at which the envelope signal 111 is supplied to the power amplifier 107 and the time at which the phase modulated signal 112 is supplied to the power amplifier 107 are made in detail below with reference to FIG. 3.

Figure 3:
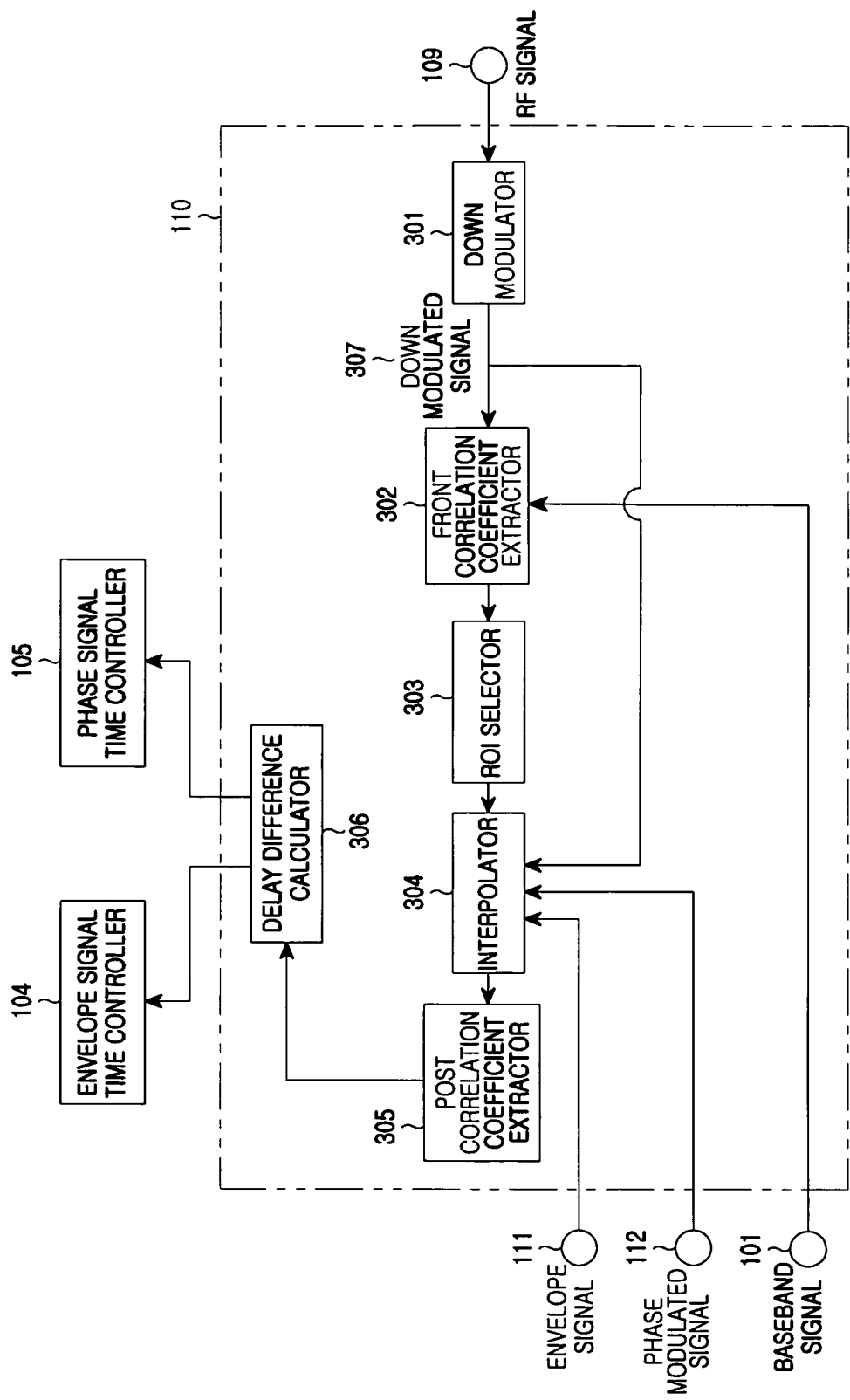
FIG. 3 is a detailed block diagram illustrating a delay difference measurer according to an exemplary embodiment of the present invention.

FIG. 3 is a detailed block diagram illustrating a delay difference measurer 110 according to an exemplary embodiment of the present invention. The delay difference measurer 110 uses a correlation coefficient extraction and interpolation technique for accurate delay measurement.

Referring to FIG. 3, the delay difference measurer 110 includes a down modulator 301, a front correlation coefficient extractor 302, a Region of Interest (ROI) selector 303, an interpolator 304, a post correlation coefficient extractor 305, and a delay difference calculator 306.

Figure 4:
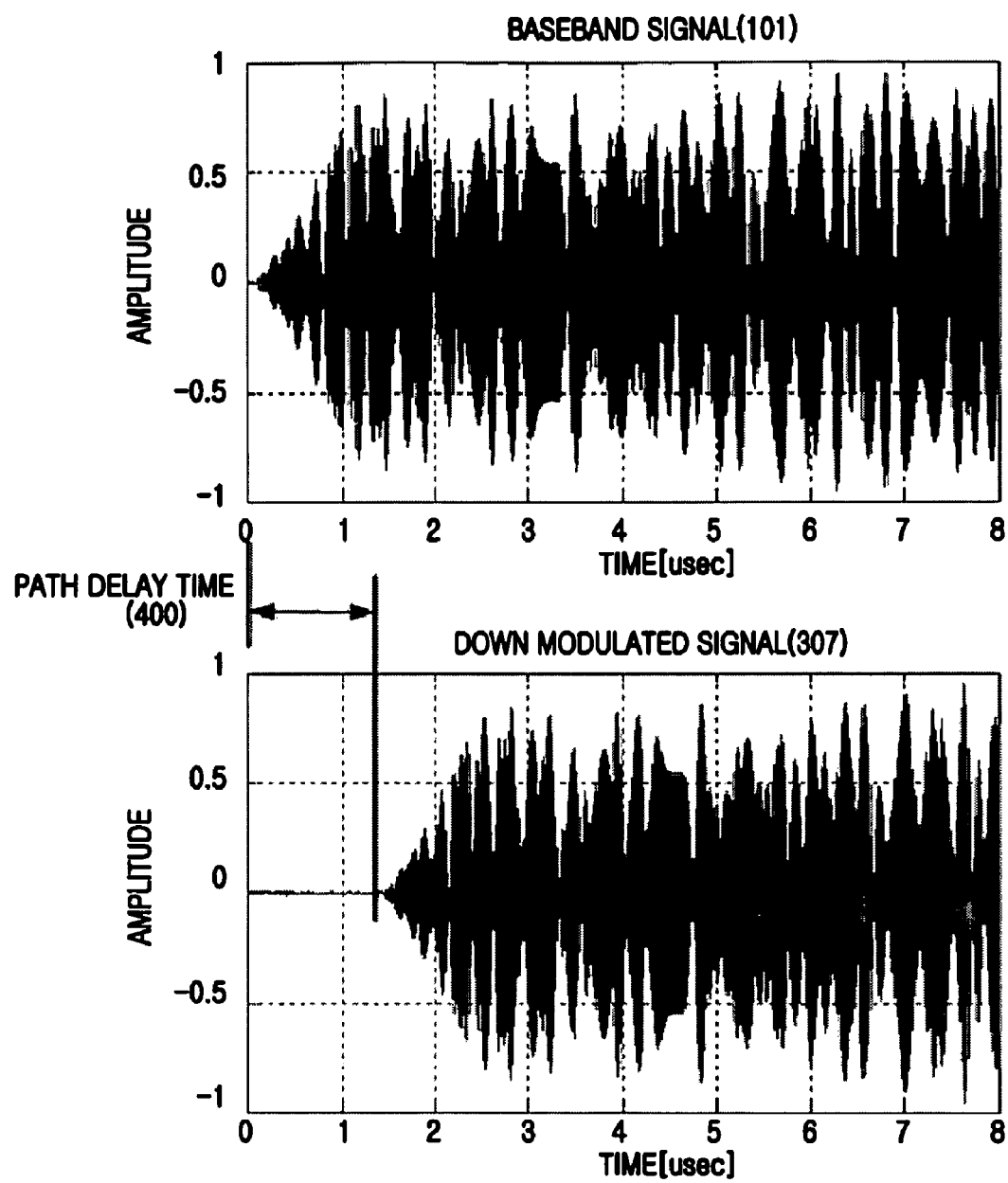
FIG. 4 is a diagram illustrating an example of a path delay between a baseband signal and a down modulated signal.

Operation of the delay difference measurer 110 is described below. The down modulator 301 down-converts an RF signal 109 output from the power amplifier 107 into a baseband signal. FIG. 4 shows a comparison between a baseband signal 101 and a down modulated signal 307 suffering a delay. FIG. 4 shows a start time point of a path delay time 400 by calculating a correlation coefficient between the baseband signal 101 and the down converted signal 307 and detecting the maximum point of a correlation coefficient value.

Figure 5:
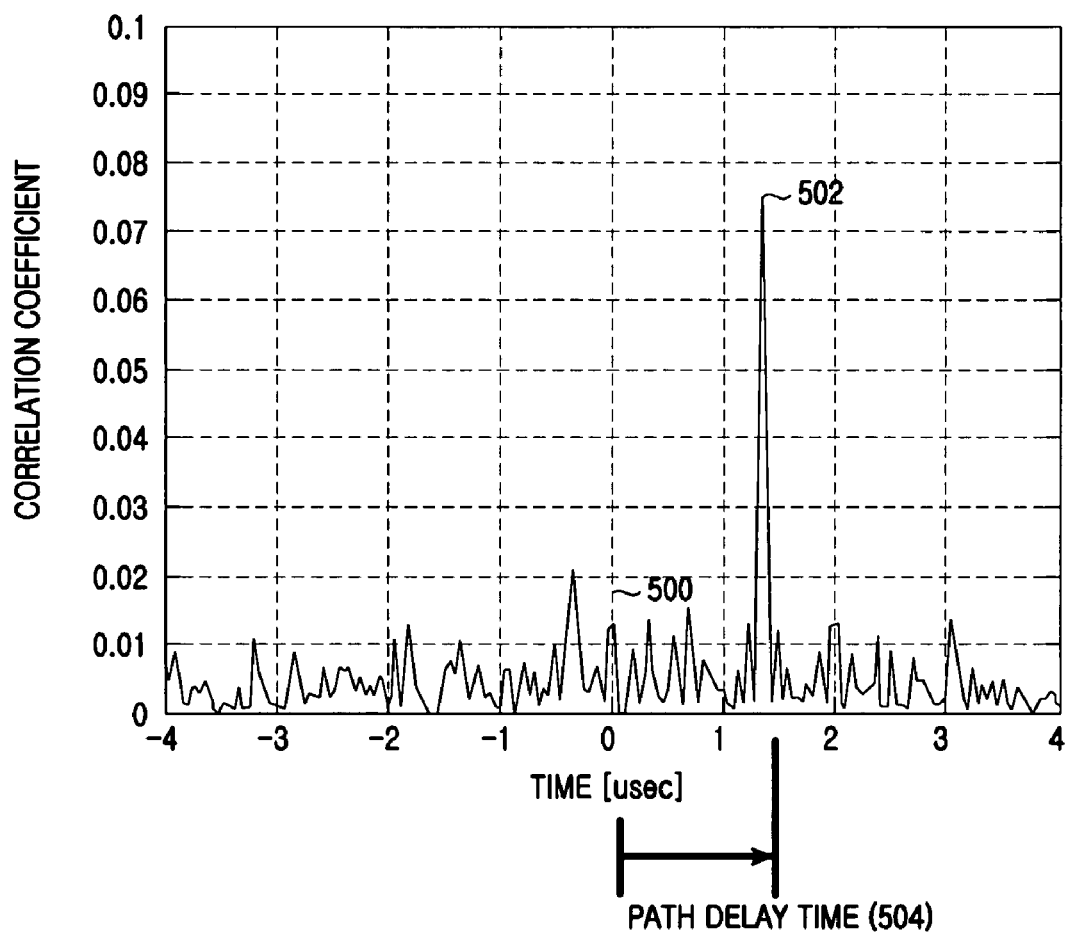
FIG. 5 is a graph illustrating a correlation coefficient depending on a path delay between a baseband signal and a down modulated signal.

The front correlation coefficient extractor 302 calculates a correlation coefficient between the down converted signal 307 and the baseband signal 101. The front correlation coefficient extractor 302 calculates a correlation coefficient value based on a sampling clock unit between the baseband signal 101 and the down modulated signal 307. The front correlation coefficient extractor 302 can determine a start time point of the down modulated signal 307 on the basis of the calculated correlation coefficient value. FIG. 5 shows a result of calculating a correlation coefficient between a down modulated signal suffering a path delay and a baseband signal as in FIG. 4 and corresponding the calculated correlation coefficient to a path delay value. FIG. 5 shows a maximum correlation coefficient value 502 obtained at a path delay time value 500. Through this, an approximate path delay time value 504 of the down modulated signal can be obtained.

Figure 6:
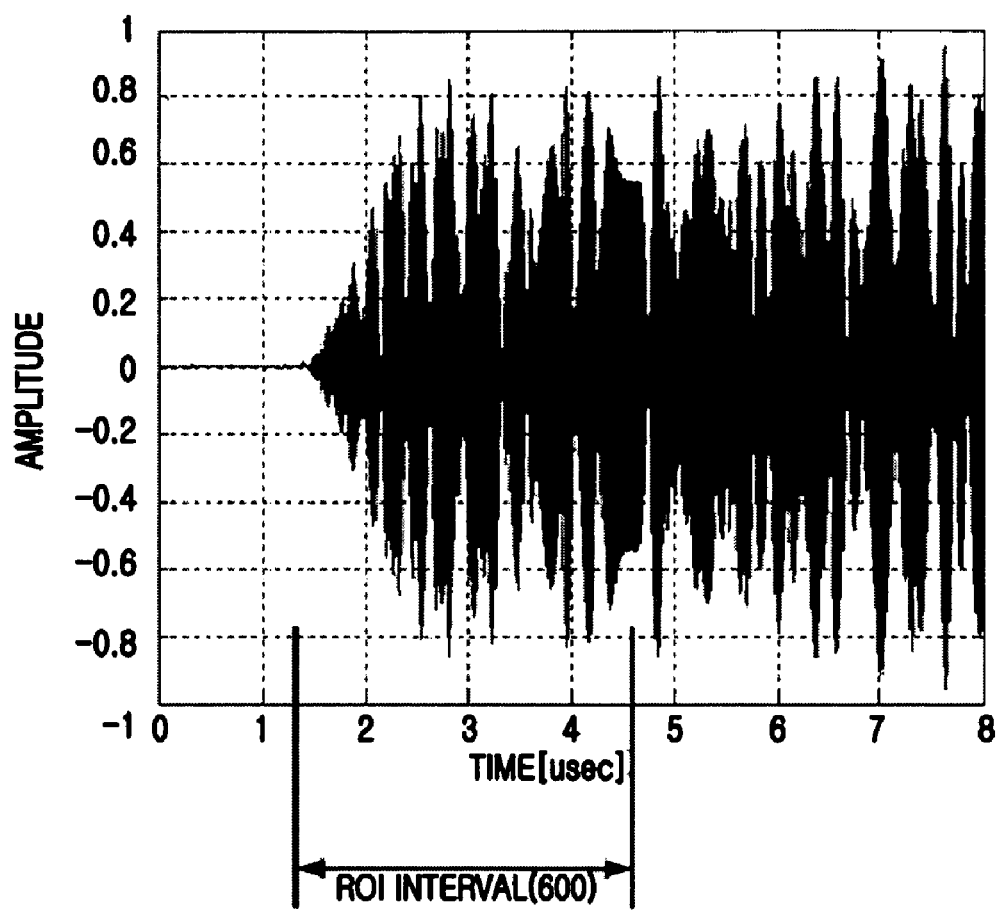
FIG. 6 is a graph illustrating an example of selection of a Region Of Interest (ROI) interval.

The ROI selector 303 selects a signal interval for interpolating the down converted signal 307, an envelope signal 111, and a phase modulated signal 112 on the basis of a correlation coefficient. The reason why the ROI selector 303 selects the signal interval is to reduce an amount of an operation carried out by the post correlation coefficient extractor 305 for measuring an accurate delay between respective signals. FIG. 6 shows an example of selecting an ROI from the down converted signal 307 depending on the path delay time calculation result of FIG. 4. As shown in FIG. 6, an ROI interval 600 can be limited in length depending on an operation capability of a post stage (e.g., the interpolator 304 or the post correlation coefficient extractor 305) of the ROI selector 303. That is, the ROI interval 600 starting from a path delay time calculated in the front correlation coefficient extractor 302 can be determined depending on a size of a memory for operations of the interpolator 304 or the post correlation coefficient extractor 305.

The interpolator 304 interpolates the envelope signal 111, the phase modulated signal 112, and the down modulated signal 307 for the ROI interval 600 determined by the ROI selector 303. Because the interpolation is not to increase a sampling frequency, the interpolator 304 does not multiply a clock of a digital block. Merely, the interpolator 304 performs an interpolation for a sample value of each signal.

A function of interpolating the down modulated signal 307 can be realized in various methods. For example, a method for interpolating a value between discrete points of the down modulated signal 307 can use zero padding that can be obtained by simply padding zeros to a signal. A degree of a function applied to realize the interpolation function can be varied. However, an increase in the degree leads to an increase in a hardware resource amount for function realization and also an increase in a calculation amount. Thus, the resource and calculation amount required for function realization are determined depending on realization performance.

The post correlation coefficient extractor 305 calculates an envelope signal correlation coefficient and a phase signal correlation coefficient using an envelope signal, a down modulated signal, and a phase modulated signal each interpolated in the interpolator 304. The post correlation coefficient extractor 305 detects the maximum points of the envelope signal correlation coefficient and phase signal correlation coefficient and calculates an envelope signal delay amount ($\tau_{env}$) and a phase signal delay amount ($\tau_{ph}$).

Figure 7:
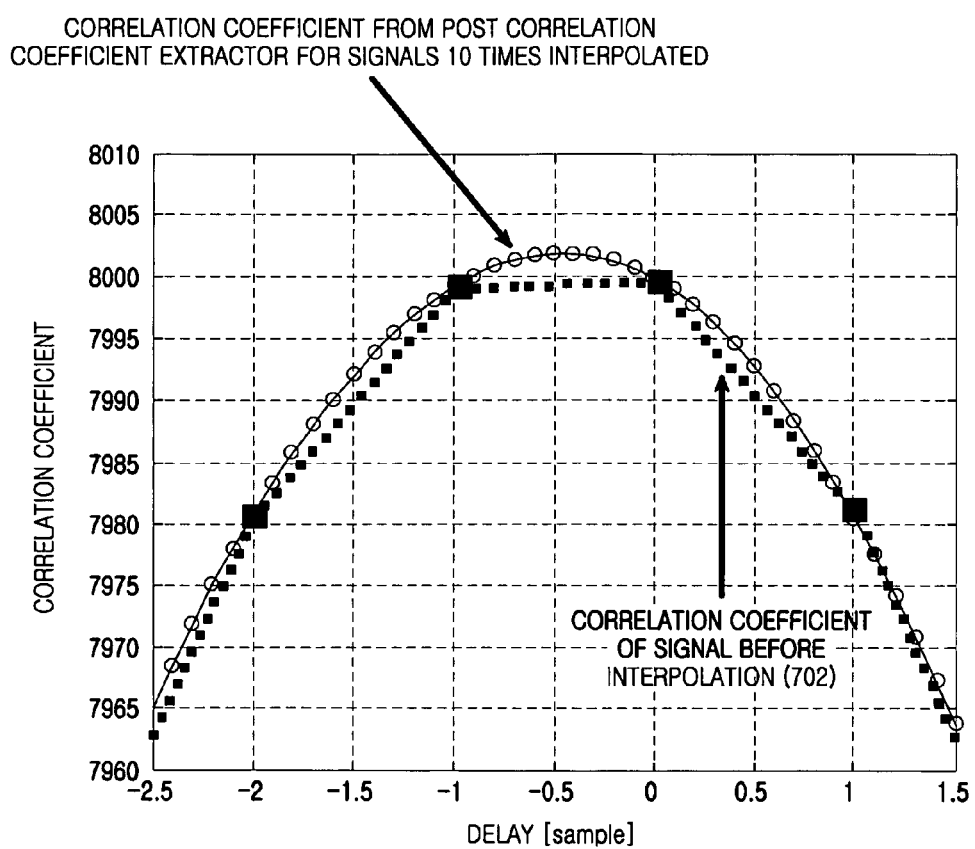
FIG. 7 is a graph illustrating a comparison between correlation coefficients before and after interpolation.

Signals before and after interpolation have the same sampling frequency, but each sample of the signal after interpolation signifies a signal value having a sampling frequency increased by an interpolation order. FIG. 7 shows the calculation result of a correlation coefficient between a down modulated signal 307 and an envelope signal 111 that are ten times interpolated for a signal interval determined in the ROI selector 303, and a correlation coefficient before interpolation 702. Samples of correlation coefficient values for the signals after interpolation show results of resolution improvement than before interpolation. The ten times interpolation applied to the down modulated signal 307 to obtain the correlation coefficient result of FIG. 7 follows a primary function. This is a scheme of performing linear interpolation between respective samples of the down modulated signal 307. The maximum correlation coefficient between signals before interpolation shows no delay, but a correlation coefficient result value between signals after interpolation shows a sample delay of 0.5. Thus, an increase of an interpolation order leads to improvement of a resolution for a correlation coefficient result value, thus giving a result of improvement of a resolution for a delay. Here, because a sampling frequency of a signal does not increase according to the interpolation order, there is no need to consider an increase of hardware performance following an increase in the number of clocks of a digital signal processing part.

The delay difference calculator 306 receives an envelope signal delay amount ($\tau_{env}$) and a phase signal delay amount ($\tau_{ph}$) from the post correlation coefficient extractor 305 and calculates a delay time difference ($\tau_{diff}=\tau_{env}-\tau_{ph}$). The delay difference calculator 306 sends the delay time difference ($\tau_{diff}$) to the time controllers 104 and 105. The time controllers 104 and 105 output an envelope signal 111 and a phase modulated signal 112 considering the delay times.

The delay time difference ($\tau_{diff}$) is expressed as a quotient (N) of a digital clock period (Ts) and a remainder ($\tau_{red}$). If the quotient (N) is a positive integer, it means that the envelope signal delay time ($\tau_{env}$) is longer than the phase modulated signal delay time ($\tau_{ph}$). If the quotient (N) is a negative integer, it is the reverse. The delay difference calculator 306 varies a time control set value for every path depending on the sign of 'N'. For example, the delay difference calculator 306 sets a large delay in a sampling clock unit to a signal path having a small delay and sets a delay to a signal path having a large delay by a remainder delay difference ($\tau_{red}$). For example, when the envelope signal delay time ($\tau_{env}$) is longer than the phase modulated signal delay time ($\tau_{ph}$) (N>0), the delay difference calculator 306 sets a delay to a phase modulated signal path by a delay amount given as an integer multiple of a clock period of 'N' times and sets a delay to an envelope signal path by a remainder delay difference ($\tau_{red}$). Inversely, when the envelope signal delay time ($\tau_{env}$) is shorter than the phase modulated signal delay time ($\tau_{ph}$) (N<0), the delay difference calculator 306 sets a delay to an envelope signal path by a delay amount given as an integer multiple of a clock period of 'N' times and sets a delay to a phase modulated signal path by a remainder delay difference ($\tau_{red}$).

Figure 8:
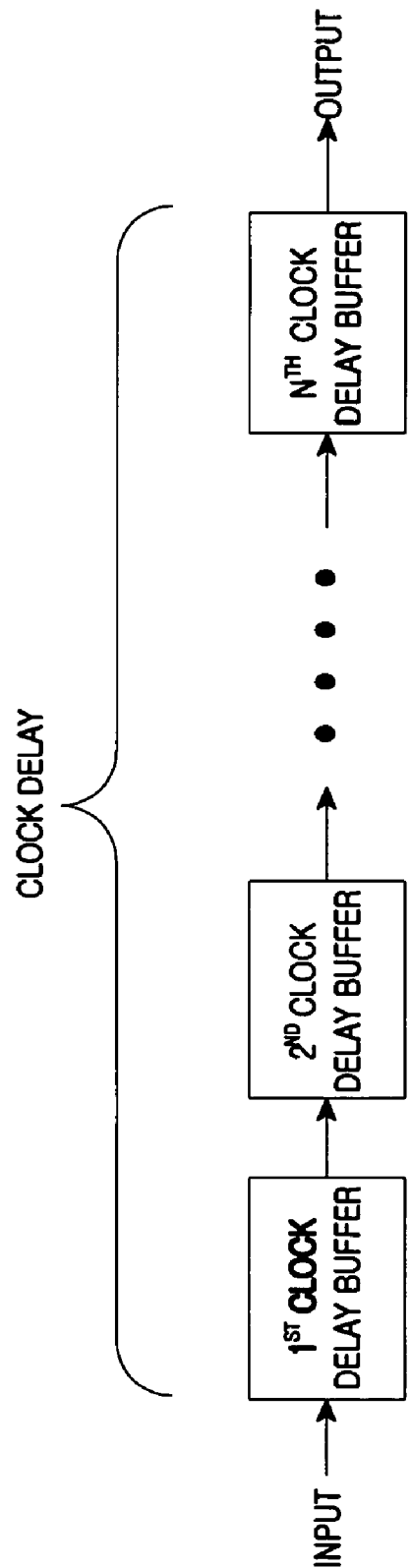
FIG. 8 is a block diagram illustrating an example of a clock unit delay buffer.

In the case of the delay amount given as an integer multiple of the clock period, a delay can be controlled by inserting a buffer into a corresponding signal path. FIG. 8 shows a method of delay control using buffer insertion. In FIG. 8, when the delay time difference ($\tau_{diff}$) is expressed as a quotient (N) of a digital clock period (Ts) and a remainder ($\tau_{red}$), a first clock delay buffer, a second clock delay buffer, . . . , an $N^{th}$ clock delay buffer are inserted into the corresponding signal path (i.e., an envelope signal path or a digital modulated signal path), thus controlling a delay by an integer multiple of a clock period of 'N' times.

In the case of setting a delay to the other signal path (i.e., the envelope signal path or the phase modulated signal path) by a delay amount smaller than a clock period, an output signal (s'(t)) is determined using a relationship between a resolution parameter (M) for an input signal (s(t)) and a remainder delay difference ($\tau_{red}$). A relationship between the input signal (s(t)) and the output signal (s'(t)) can be obtained from an equation of higher degree.

Figure 9A:
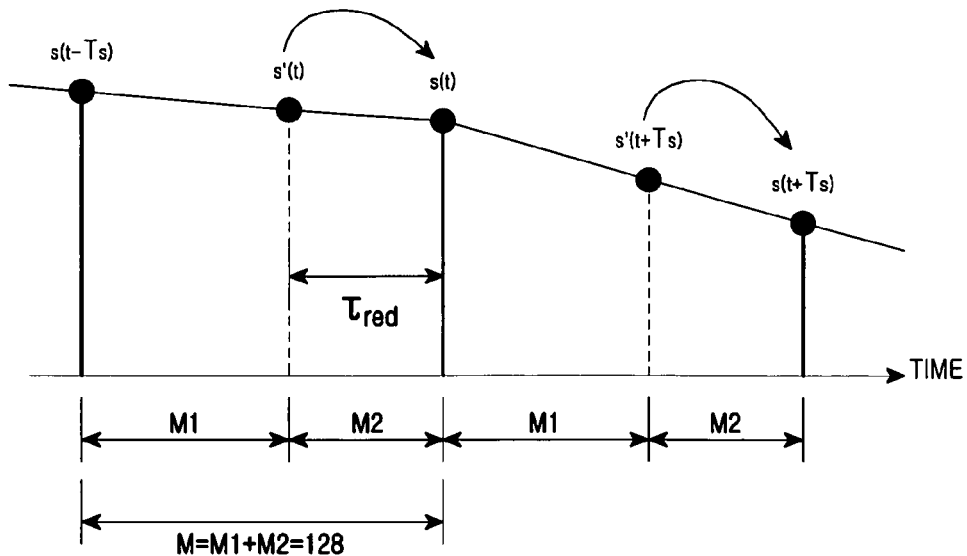
FIG. 9 is a graph illustrating a relationship between a delay quantity and a signal.
Figure 9B:
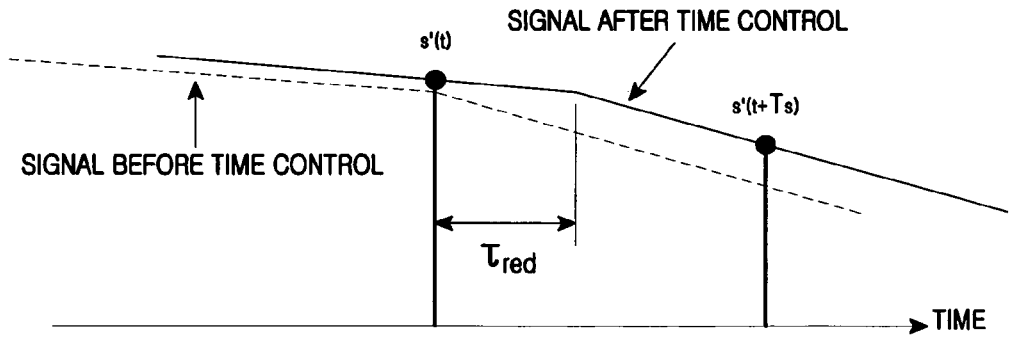

FIG. 9A shows a relationship between a signal for performing a delay control and a remainder delay difference, and FIG. 9B shows an example of a signal reflecting a delay control.

That is, in FIG. 9A, an output signal (s'(t)) is output responsive to an input signal (s(t)) by a set remainder delay difference ($\tau_{red}$). The output signal (s'(t)) can be inferred from an equation of higher degree.

For example, the s'(t) output responsive to the s(t) using a primary equation is given in the equation below:

$$s'(t) = \frac{M1 * s(t) + M2 * s(t\text{-}Ts)}{M}$$

$$M = 2^7 = 128$$

$$M2 = \frac{\tau_{red}}{Ts/M}, M1 = M - M2$$

where,
s(t−Ts): input signal for performing delay control,
M, M1, M2: resolution parameters,
Ts: clock period,
s'(t): output signal for input signal (s(t−Ts)) depending on delay setting, and
$\tau_{red}$: remainder delay difference.

The value 'M' defined in FIG. 9A determines a resolution. As 'M' increases, the resolution gets better. However, it is advantageous that 'M' is defined as an exponential value of '2' when 'M' is set considering the resolution to minimize hardware resources that are necessary for realizing an operation function using hardware such as a Field-Programmable Gate Array (FPGA). That is because if 'M' is defined as the exponential value of '2', it is possible to substitute an operation of division with a shift register for a binary number expression value.

Figure 10:
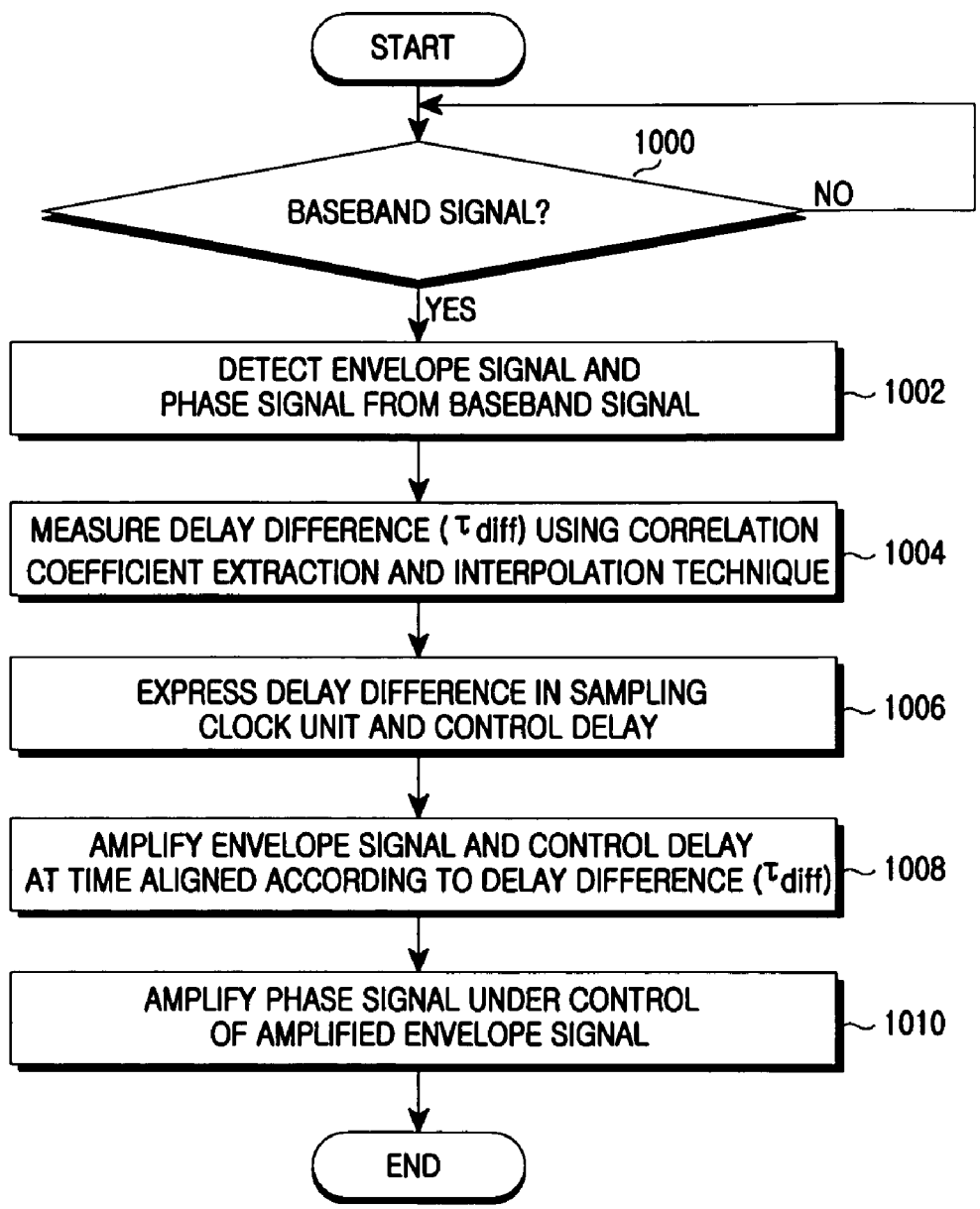
FIG. 10 is a flow diagram illustrating a process of power amplification based on EER according to an exemplary embodiment of the present invention.

FIG. 10 is a flow diagram illustrating a process of power amplification based on EER according to an exemplary embodiment of the present invention.

Referring to FIG. 10, signal converters 102 and 103 identify if there is a baseband signal in step 1000 and separate and detect an envelope signal and a phase signal from the baseband signal in step 1002.

Then, in step 1004, a delay difference measurer 110 measures a delay difference ($\tau_{diff}$) between an envelope signal path and a phase signal path using a correlation efficient extraction and interpolation technique.

Then, in step 1006, the delay difference measurer 110 expresses the delay difference ($\tau_{diff}$) in a sampling clock unit and performs delay setting.

Then, in step 1008, an envelope signal amplifier 108 amplifies the envelope signal and an up modulator 106 up modulates the phase signal at a time aligned according to the delay setting.

Then, in step 1010, a power amplifier 107 amplifies the phase modulated signal under control of the amplified envelope signal.

Then, the process of power amplification according to an exemplary embodiment of the present invention is terminated.

Figure 11:
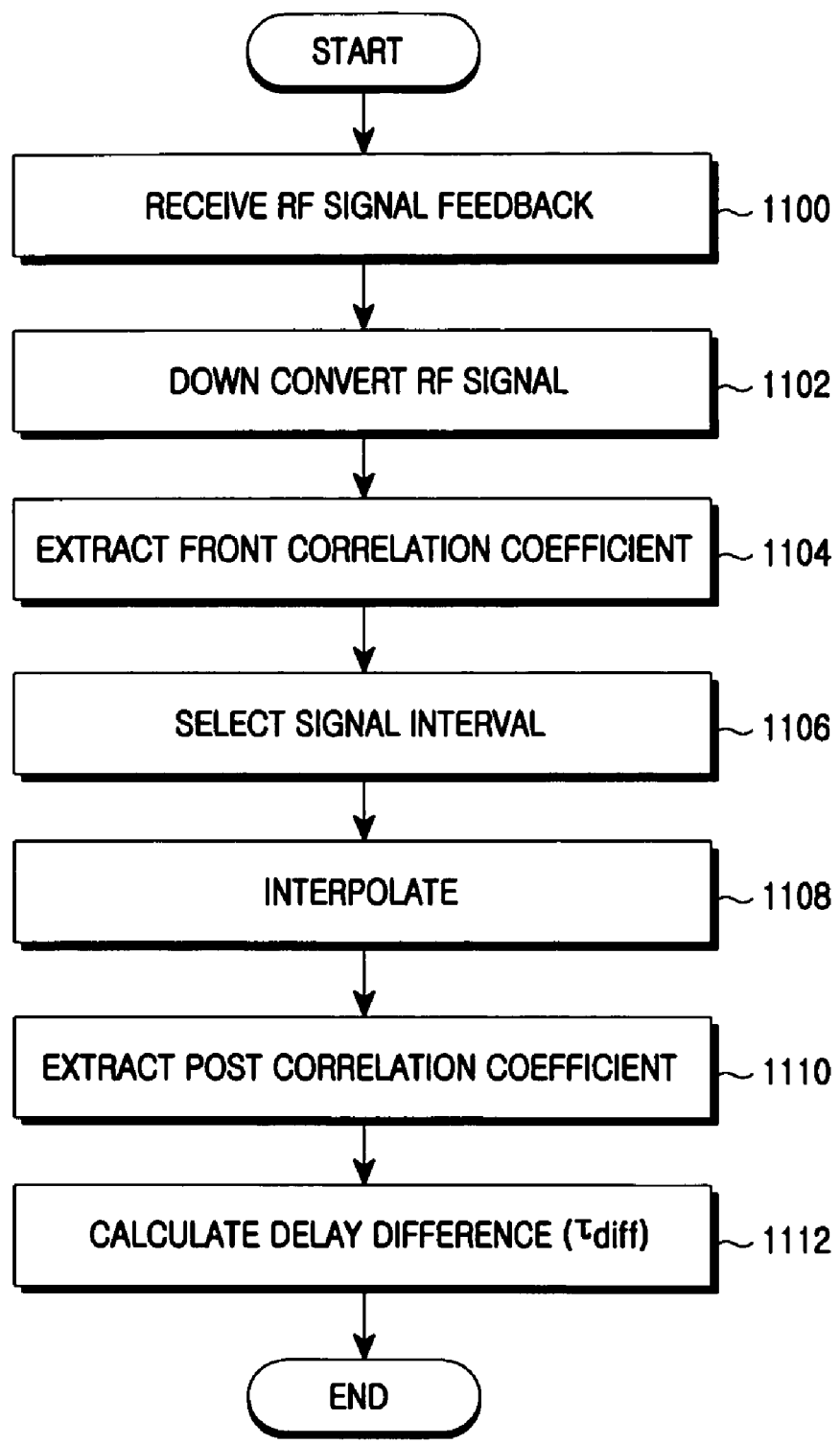
FIG. 11 is a flow diagram illustrating a process of calculating a delay difference according to an exemplary embodiment of the present invention.

FIG. 11 is a flow diagram illustrating a process of calculating a delay difference according to an exemplary embodiment of the present invention.

Referring to FIG. 11, in step 1100, a down modulator 301 receives an RF signal feedback.

Then, in step 1102, the down modulator 301 down modulates the received RF signal into a baseband signal.

Then, in step 1104, a front correlation coefficient extractor 302 calculates a correlation coefficient between the down-modulated baseband signal and the original baseband signal.

Then, in step 1106, an ROI selector 303 determines a start time point of the down modulated signal on the basis of the calculated correlation coefficient value and selects an ROI signal interval for performing interpolation. The reason why the ROI selector 303 selects the ROI signal interval is to reduce an amount of an operation carried out by a post correlation coefficient extractor 305 for measuring an accurate delay between respective signals. That is, the ROI interval 600 starting from a path delay time calculated in the front correlation coefficient extractor 302 can be determined depending on a size of a memory for an operation of an interpolator 304 or the post correlation coefficient extractor 305.

Then, in step 1108, the interpolator 304 interpolates an envelope signal, a phase modulated signal, and the down modulated signal for the determined ROI signal interval.

Because the interpolation is not to increase a sampling frequency, the interpolator 304 does not multiply a clock of a digital block. Merely, the interpolator 304 interpolates a sample value of each signal. The interpolation function can be realized in various methods. For example, a method for interpolating a value between discrete points of the down modulated signal 307 can use zero padding that can be obtained by simply padding zeros to a signal.

Then, in step 1110, the post correlation coefficient extractor 305 calculates correlation coefficients of the interpolated envelope signal and interpolated phase-modulated signal for the interpolated down-modulated signal.

Then, in step 1112, a delay difference calculator 306 calculates a delay time difference (τdiff) between an envelope signal delay amount (τenv) and a phase signal delay amount (τph). The delay time difference (τdiff) is expressed as a quotient (N) of a digital clock period (Ts) and a remainder (τred). If the quotient (N) is a positive integer, it means that the envelope signal delay time (τenv) is longer than the phase modulated signal delay time (τph). If the quotient (N) is a negative integer, it is the reverse.

Then, the transmitting apparatus terminates the process of measuring the delay difference.

Figure 12:
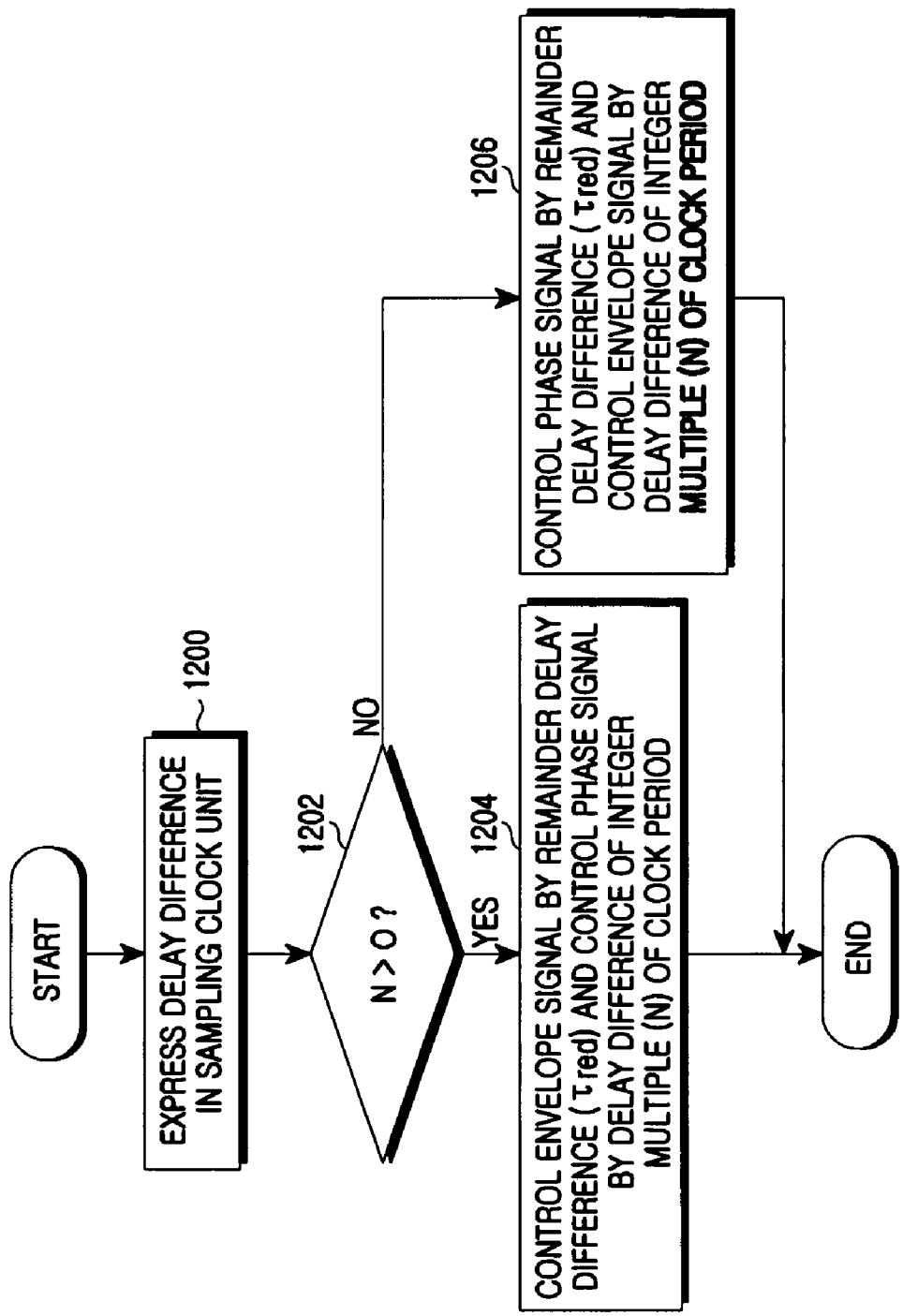
FIG. 12 is a flow diagram illustrating a process of delay setting depending on a delay difference according to an exemplary embodiment of the present invention.

FIG. 12 is a flow diagram illustrating a process of delay setting according to an exemplary embodiment of the present invention.

Referring to FIG. 12, in step 1200, a delay difference measurer 110 expresses a delay difference in a sampling clock unit.

Then, if the quotient (N) is greater than 0 (i.e., if an envelope signal delay time (τenv) is longer than a phase modulated signal delay time (τph)) in step 1202, the delay difference measurer 110 sets a delay to a phase modulated signal path by a delay amount given as an integer multiple of a clock period of 'N' times and sets a delay to an envelope signal path by a remainder delay difference (τred) in step 1204.

If the quotient (N) is less than 0 (i.e., if the envelope signal delay time (τenv) is shorter than the phase modulated signal delay time (τph)) in step 1202, the delay difference measurer 110 sets a delay to an envelope signal path by a delay amount given as an integer multiple of a clock period of 'N' times and sets a delay to a phase modulated signal path by a remainder delay difference (τred) in step 1206.

Then, the delay difference measurer 110 terminates the process of delay setting.

As described above, an exemplary embodiment of the present invention has an advantage of compensating for a delay through correlation coefficients of an envelope signal, a phase signal, and a baseband signal and interpolation and performing power amplification, thereby being able to accurately measure a signal delay difference between respective paths, enhance the accuracy of time alignment, and prevent a distortion of a spectrum performance of a final RF signal on an EER basis in a wireless communication system.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A transmitting apparatus for power amplification with delay control in a wireless communication system, the apparatus comprising:
   one or more signal converters for separating a baseband signal into an envelope signal and a phase modulated signal;
   a delay difference measurer for measuring a delay difference between an envelope signal path and a phase modulated signal path using a correlation coefficient extraction and interpolation technique; and
   a delay controller for, depending on the measured delay difference, setting a delay in a clock period unit to a signal path having a small delay and setting a delay by a remainder delay difference to a signal path having a large delay,
   wherein the delay difference measurer comprises:
      a down modulator for down converting a radio frequency (RF) signal into a baseband signal;
      a front correlation coefficient extractor for calculating a correlation coefficient between the down converted signal and an input baseband signal;
      a Region Of Interest (ROI) selector for determining an ROI signal interval based on the correlation coefficient;
      an interpolator for interpolating an envelope signal, a phase modulated signal, and a down converted signal for the determined ROI interval;
      a post correlation coefficient extractor for calculating an envelope signal correlation coefficient and a phase signal correlation coefficient using the interpolated envelope signal, interpolated down-converted signal, and interpolated phase-modulated signal; and
      a delay difference calculator for receiving an envelope signal delay amount ($\tau_{env}$) and a phase signal delay amount ($\tau_{ph}$) from the post correlation coefficient extractor and calculating a delay time difference ($\tau_{diff} = \tau_{env} - \tau_{ph}$).

2. The apparatus of claim 1, wherein the post correlation coefficient extractor calculates a correlation coefficient value based on a sampling clock period unit between the baseband signal and the down modulated signal and determines a start time point of the down modulated signal.

3. The apparatus of claim 1, wherein the ROI signal interval is limited by an operation capability of the post correlation coefficient extractor.

4. The apparatus of claim 1, wherein the interpolator interpolates a sample value of each signal without multiplying a clock of a digital block.

5. The apparatus of claim 1, wherein the signals before and after interpolation have the same sampling frequency, but each sample of the down modulated signal after interpolation is linearly interpolated by an interpolation order and has an improved resolution for a delay.

6. The apparatus of claim 1, wherein the delay difference calculator expresses the delay time difference ($\tau_{diff}$) as a quotient (N) of a digital clock period (Ts) and a remainder ($\tau_{red}$).

7. The apparatus of claim 1, wherein when an envelope signal delay time ($\tau_{env}$) is longer than a phase modulated signal delay time ($\tau_{ph}$) (N>0), the delay controller sets a delay to the phase modulated signal path by a delay amount given as an integer multiple of a clock period of 'N' times and sets a delay to the envelope signal path by a remainder delay difference ($\tau_{red}$), and when the envelope signal delay time ($\tau_{env}$) is shorter than the phase modulated signal delay time ($\tau_{ph}$) (N<0), sets a delay to the envelope signal path by a delay amount given as an integer multiple of a clock period of 'N' times and sets a delay to the phase modulated signal path by a remainder delay difference ($\tau_{red}$).

8. The apparatus of claim 7, wherein when a delay is set by the delay amount given as the integer multiple of the clock period, the delay is controlled by inserting a buffer into the corresponding signal path.

9. The apparatus of claim 7, wherein when a delay is set by a difference of a delay amount smaller than the clock period, an output signal (s' (t)) responsive to an input signal (s(t)) is determined using an equation of higher degree based on a relationship between a resolution parameter (M) and a remainder delay difference ($\tau_{red}$).

10. The apparatus of claim 9, wherein the resolution parameter (M) is defined as an exponential value of '2'.

11. The apparatus of claim 1, further comprising an amplification unit for amplifying the phase signal depending on the envelope signal.

12. The apparatus of claim 11, wherein the amplification unit comprises:
an envelope signal amplifier for amplifying the envelope signal and supplying a power source to a power amplifier;
an up modulator for up modulating the phase signal into an RF band signal; and
the power amplifier for amplifying the up-modulated phase signal depending on the amplitude of the envelope signal.

13. A method for power amplification with delay control in a wireless communication system, the method comprising:
separating a baseband signal into an envelope signal and a phase modulated signal;
measuring a delay difference between an envelope signal path and a phase modulated signal path using a correlation coefficient extraction and interpolation technique; and
setting a delay in a clock period unit to a signal path having a small delay and setting a delay by a remainder delay difference to a signal path having a large delay, depending on the measured delay difference,
wherein the measuring of the delay difference comprises:
down converting a radio frequency (RF) signal into a baseband signal;
calculating a correlation coefficient between the down converted signal and an input baseband signal;
determining a Region Of Interest (ROI) signal interval based on the correlation coefficient;
interpolating an envelope signal, a phase modulated signal, and a down converted signal for the determined ROI interval;
calculating an envelope signal correlation coefficient and a phase signal correlation coefficient using the interpolated envelope signal, interpolated down-converted signal, and interpolated phase-modulated signal; and
receiving an envelope signal delay amount ($\tau_{env}$) and a phase signal delay amount ($\tau_{ph}$) from a post correlation coefficient extractor and calculating a delay time difference ($\tau diff=\tau_{env}-\tau_{ph}$).

14. The method of claim 13, wherein calculating of envelope signal correlation coefficient and phase signal correlation coefficient comprises:
calculating a correlation coefficient value based on a sampling clock period unit between the baseband signal and the down converted signal; and
determining a start time point of the down modulated signal.

15. The method of claim 13, wherein the ROI signal interval is limited by an operation capability of the post correlation coefficient extractor.

16. The method of claim 13, wherein interpolating comprises:
interpolating a sample value of each signal without multiplying a clock of a digital block.

17. The method of claim 13, wherein the signals before and after interpolation have the same sampling frequency, but each sample of the down converted signal after interpolation is linearly interpolated by an interpolation order and has an improved resolution for a delay.

18. The method of claim 13, wherein calculating of the delay time difference comprises:
expressing the delay time difference ($\tau_{diff}$) as a quotient (N) of a digital clock period (Ts) and a remainder ($\tau_{red}$).

19. The method of claim 13, wherein when an envelope signal delay time ($\tau_{env}$) is longer than a phase modulated signal delay time ($\tau_{ph}$) (N>0), a delay is set to the phase modulated signal path by a delay amount given as an integer multiple of a clock period of 'N' times and a delay is set to the envelope signal path by a remainder delay difference ($\tau_{red}$), and when the envelope signal delay time ($\tau_{env}$) is shorter than the phase modulated signal delay time ($\tau_{ph}$)(N<0), a delay is set to the envelope signal path by a delay amount given as an integer multiple of a clock period of 'N' times and a delay is set to the phase modulated signal path by a remainder delay difference ($\tau_{red}$).

20. The method of claim 19, wherein when a delay is set by the delay amount given as the integer multiple of the clock period, the delay is controlled by inserting a buffer into the corresponding signal path.

21. The method of claim 19, wherein when a delay is set by a difference of a delay amount smaller than the clock period, an output signal (s' (t)) responsive to an input signal (s(t)) is determined using an equation of higher degree based on a relationship between a resolution parameter (M) defined as an exponential value of '2' and a remainder delay difference ($\tau_{red}$).

22. The method of claim 13, further comprising amplifying the phase signal depending on the envelope signal.

23. The method of claim 22, wherein amplifying the phase signal comprises:
amplifying the envelope signal and supplying a power source to a power amplifier;
up modulating the phase signal into an RF band signal; and
amplifying the up modulated phase signal depending on the amplitude of the envelope signal.

* * * * *